United States Patent [19]

Kirsch et al.

[11] Patent Number: 4,583,157
[45] Date of Patent: Apr. 15, 1986

[54] INTEGRATED CIRCUIT HAVING A VARIABLY BOOSTED NODE

[75] Inventors: Howard C. Kirsch, Emmaus, Pa.; James H. Stefany, Asbury, N.J.

[73] Assignee: AT&T Bell Laboratories, Murray Hill, N.J.

[21] Appl. No.: 699,794

[22] Filed: Feb. 8, 1985

[51] Int. Cl.[4] .......................... H02M 3/18; H03K 5/02
[52] U.S. Cl. ...................................... 363/60; 307/246; 307/264
[58] Field of Search .................. 363/59, 60; 307/246, 307/577, 578, 584, 264

[56] References Cited

U.S. PATENT DOCUMENTS

| | | | |
|---|---|---|---|
| 4,199,806 | 4/1980 | Patterson, III | 363/60 |
| 4,250,414 | 2/1981 | Kirsch | 363/60 X |
| 4,344,003 | 8/1982 | Harmon et al. | 307/264 X |
| 4,346,310 | 8/1982 | Carter | 363/60 X |
| 4,499,387 | 2/1985 | Konishi | 307/246 X |

FOREIGN PATENT DOCUMENTS

| | | | |
|---|---|---|---|
| 0006670 | 1/1981 | Japan | 363/60 |
| 0062066 | 5/1981 | Japan | 363/60 |

*Primary Examiner*—Peter S. Wong
*Attorney, Agent, or Firm*—James H. Fox

[57] ABSTRACT

An integrated circuit comprises a node that is boosted by one or more boost capacitors depending on the level of the power supply voltage. When the level is below a given threshold, a first booster capacitor is activated. Additional boost capacitors may be provided for activation at still lower thresholds. The boost capacitors are deactivated when the power supply level exceeds the corresponding thresholds. In this manner, a more constant boosted voltage is obtained. This provides for an adequate boosted voltage at low power supply levels, while avoiding excessive boost at high power supply voltages that could damage devices. The technique may be used for boosted row conductors in dynamic random access memories, among other applications.

7 Claims, 5 Drawing Figures

INTEGRATED CIRCUIT HAVING A VARIABLY BOOSTED NODE

BACKGROUND OF THE INVENTION

1. Field of the Invention

The present invention relates to an integrated circuit having at least one electrical conductor boosted to a voltage in excess of a power supply voltage.

2. Description of the Prior Art

The use of voltages in excess of the power supply voltage is common in integrated circuits, especially those implemented in field effect transistor (FET) technology. The "boosted node" technique is used typically to overcome the threshold voltage drop (Vth) of a FET when it is desired to pass a signal therethrough (i.e., from source to drain) without reducing the magnitude of the signal. For example, in dynamic random access memory (DRAM) design, the use of a boosted row conductor is typical. This technique increases the gate voltage on the access transistors in a selected row so that the threshold voltage drop does not substantially reduce the voltage level of the data stored in the respective storage capacitors. Other boosted node applications include boosting a clock or logic signal applied to transmission gate FET's, for performing delay and logic functions.

A typical prior art circuit for obtaining a boosted voltage is shown in FIG. 1, with others being known in the art. An input signal, for example a clock signal, is applied to input node 100. The voltage of the input signal assumes either a high or low level at a given time. These levels may be the values of the positive and negative power supply voltages supplied to the integrated circuit (for example, 0 and 5 volts), or other values sufficient to switch M11 between conducting and nonconducting states. When in the low voltage state (0 volts) the inverter 101 places a high voltage level on the gate of transistor M10, allowing it to conduct. Hence, the output node 102 is placed at the level of Vss, the negative supply voltage (0 volts). When the input signal goes to a high level (5 volts), inverter 101 turns transistor M10 off. Also, transistor M11 is turned on, so that positive power supply voltage, Vcc, minus the threshold voltage drop of M11, initially appears at output node 102. If Vth for M11 is 1.5 volts, for example, then 5−1.5=3.5 volts initially appears at node 102.

The boost capacitor 106 is also charged at this time, since the 3.5 volt signal appears on the plate connected to node 102, and a low voltage, about 0 volts, initially is present on the opposite plate, at node 105. The node 105 remains at this low voltage state until the above-noted high voltage (3.5 volts) from node 102 is propagated through inverter 103, 104. This short delay time allows the charging of the boost capacitor. When the high voltage state propagates from node 102 through the inverters 103, 104, the capacitor plate at node 105 is placed at a high (e.g., 5 volt) level by inverter 104. The voltage on the opposite plate (at node 102) is "boosted" from 3.5 volts to a higher voltage level. The maximum boost value will be determined in part by the load connected to node 102. For example, a load capacitance $C_{LOAD}$ reduces the boost by dividing the voltage available from boost capacitor 106. When the input signal returns to a low level, the output node 102 is also returned to a low level, by conduction through M10 as above. The boosted voltage at node 102 may also decay to a lower value than the maximum boost value due to leakage currents even before this time.

One problem with prior art boost generators has become more apparent as the gate oxides of devices connected to the boosted node are decreased. Then, the electric fields increase across such devices if the boost voltage is maintained at a given value. For example, the gate oxides of DRAM access transistors are subjected to excessive electrical stress if subjected to the high fields produced by prior art techniques over prolonged periods of time. This can lead to failure of a device, or degradation of its performance. Therefore, means have been included in boost generators to limit the amount of boost they produce. For example, diode 107 in FIG. 1 has been added to prevent the boosted voltage on output node 102 from exceeding the positive power supply voltage level by more than one diode voltage drop. This limits the boost to about Vcc+0.6 volts in the case of a slilcon diode. A typical graph showing the boosted voltage versus Vcc for the case of diode limiting is shown in FIG. 2 for the exemplary circuit of FIG. 1. Other voltage limiting means, for example a diode-connected FET, are also possible for achieving similar results.

SUMMARY OF THE INVENTION

We have invented a boost generator circuit suitable for implementing in integrated circuit form wherein the degree of boost is varied by activating one or more boost capacitors. The number of capacitors providing the boose is determined by the level of the power supply voltage applied to the integrated circuit.

DETAILED DESCRIPTION

The following detailed description relates to a technique for varying the boost voltage on a boosted node. This technique provides for activating a varying number of boost capacitors depending upon the power supply voltage applied to an integrated circuit chip or wafer. This technique overcomes certain disadvantages of the above-noted prior art diode limiting technique. In particular, referring to FIG. 2, the prior art limiting technique provides that the boosted voltage still increases linearly with power supply increase. Hence, at low Vcc values (e.g., 4.5 volts) the boosted voltage is relatively low (e.g., 5.1 volts). This can degrade the performance of circuits receiving the boosted voltage. At high Vcc values (e.g., 7 volts), the boosted voltage is then proportionately higher (e.g., 7.6 volts). This may lead to premature failure of devices receiving the boosted voltage. Furthermore, the use of a limiting diode results in a transient current flow, or "spike" from the boosted node to the Vcc supply each time the boost signal is applied. This can inject noise and voltage fluctuations into the power supply and associated circuits. Also, in the case of dynamic random access memories wherein information is stored as charge in a storage capacitor, the current spike can inject electrical carriers into the substrate that can interfere with the stored information.

Figure 3:
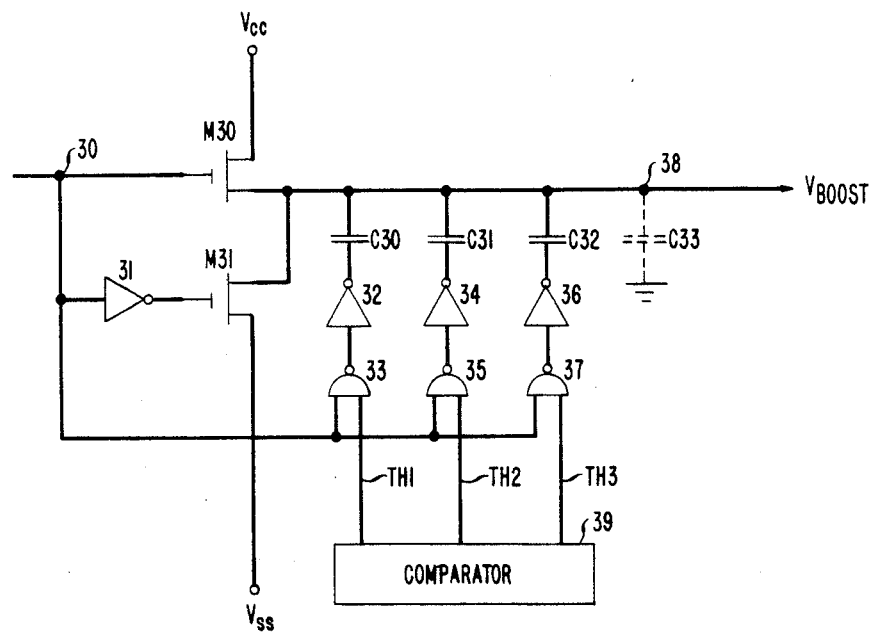
FIG. 3 illustrates an embodiment of the variable boost generator of the present invention.

The present invention is illustrated in an exemplary embodiment in FIG. 3. An input signal applied to input node 30 causes transistor M30 to conduct when node 30 is at a high voltage state. The input signal may itself be at an initially boosted level, and then return to Vcc prior to the activation of the boost capacitors, as is assumed for the exemplary case herein, in which case the conduction of M30 places the output node 38 at approximately the level of Vcc. However, the input signal can alternately be unboosted; it is then typically a threshold voltage drop below Vcc when in the high state herein. In that case, output node 38 is placed, assuming a negligible load resistance thereon, at Vcc-Vth volts.

Assuming initially that Vcc is at a relatively high level (e.g., 7 volts), no boost capacitors are activated. When the level of Vcc goes below a first threshold level, a first threshold line TH1 is activated by being placed at a high level by comparator 39. This allows NAND gate 33 to respond to the input signal, thus causing inverter 32 to bring one plate of boost capacitor 32 to a high level when the input signal is high. This in turn causes the opposite plate of C30 to boost the voltage on the output node 38. When the level of Vcc goes below a second threshold less than the first one, the comparator activates TH2 and hence, capacitor C31 in a similar manner. A third boost capacitor, C32, is likewise activated when a third threshold is reached. The present technique may be implemented using one, or more, boost capacitors up to any number.

When the input signal goes low at node 30, transistor M30 is turned off, while M31 is turned on by inverter 31. This action discharges the boosted node to a lower voltage, typically Vss, through M31. If desired, node 38 may be discharged to a level other than Vss (0 volts), by appropriate choice of source voltage on M31. Also, when input node 30 goes low, the NAND gates 33, 35, and 37 go high, so that one plate of each of capacitors C30, C31, and C32 are brought to a low level by inverters 32, 34, and 36, respectively. This allows the boost capacitors to recharge by conduction through M31 in preparation for a subsequent boost, initiated when input node 30 again goes high.

Figure 4:
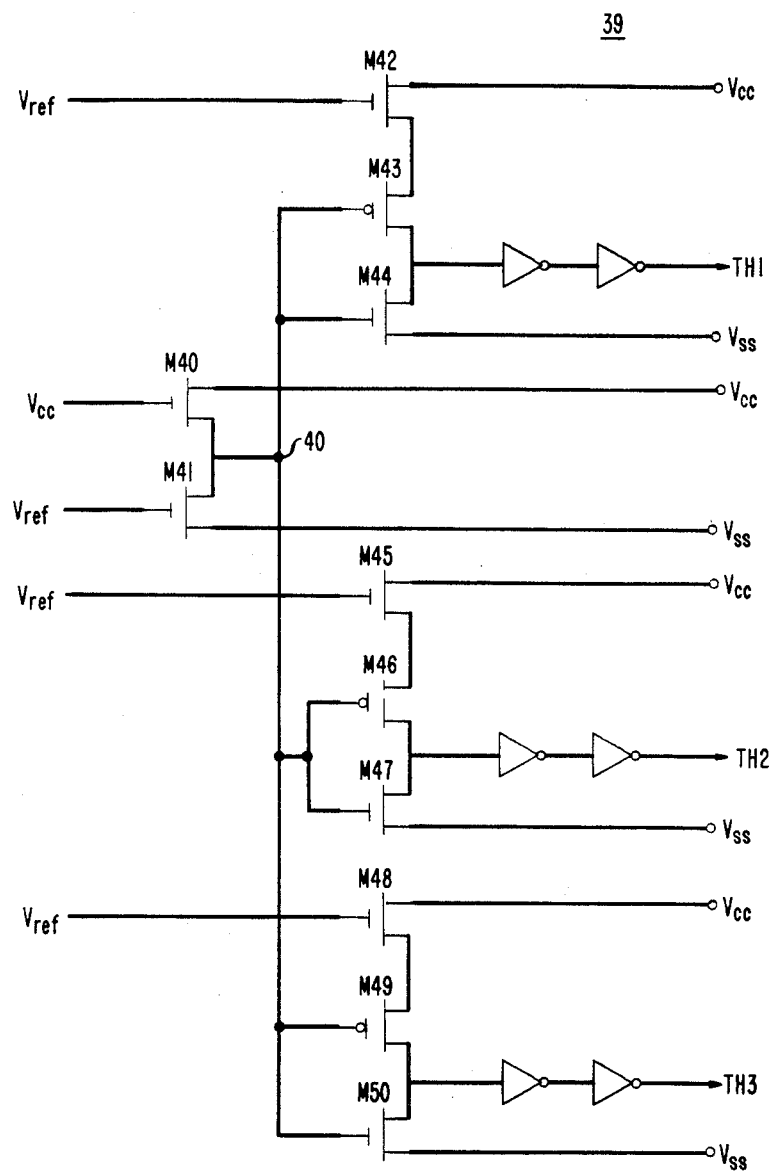
FIG. 4 illustrates a circuit embodiment of a voltage comparator suitable for implementing the present invention.

A comparator circuit suitable for use with the present technique is shown in FIG. 4, with others being possible. As shown, transistors M40 and M41 serve as a voltage divider to provide a voltage at a reduced level at node 40 that is approximately comparable to the value of the switching thresholds of the inverters connected thereto. The divided voltage at node 40 also tracks changes in Vcc. The divider transistors desirably have relative long channel lengths and narrow channel widths to reduce current flow therethrough. If desired, the Vcc value applied to the drain of M40 can be derived from the output of a logic circuit that can be clocked to a high level only when the boosted voltage is desired, to further reduce power consumption. Still other divider arrangements are possible. A level of about 2 volts is thus provided at node 40 in an exemplary case. The inverters comprise complementary transistor pairs M43-M44, M46-M47, and M49-M50. Optional voltage reduction transistors M42, M45, and M48 may be used to provide a reduced voltage across the inverters, to protect the n-channel transistors from "hot carrier" effects, if desired. A regulated reference voltage, Vref, is provided as shown, and has a typical value of about 5.5 volts. The three inverters have p- and n-channel transistors of differing gain ratios, to provide for different inverter switching thresholds. For example, choosing M49 and M50 to have equal gains provides a switching threshold of about one-half of the voltage across the pair. If the protective transistor M48 has a threshold of about 1.5 volts, then about 4 volts appears across M49-M50. Hence, the switching threshold is about 2 volts. Choosing the p-channel transistor in a pair to have a larger gain than the n-channel one produces a higher (more positive) switching threshold. The differences in gain are usually produced by differences in size of the transistors; an increase in channel width, or a decrease in channel length, increase the gain.

Figure 2:
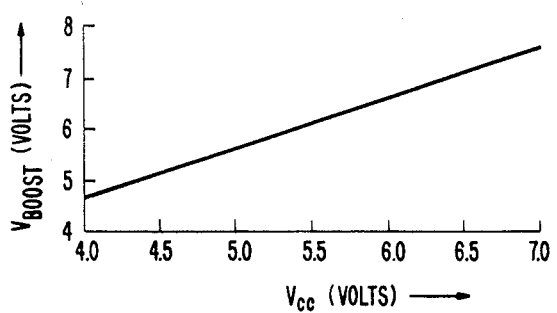
FIG. 2. illustrates the boosted voltage versus power supply voltage for the circuit of FIG. 1.
Figure 5:
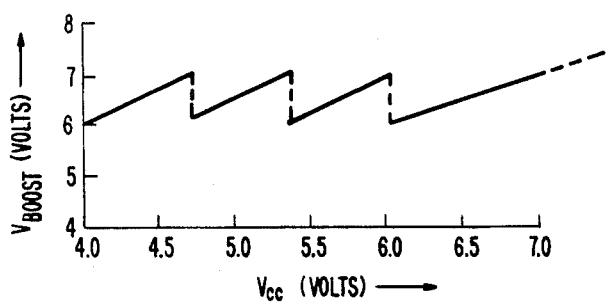
FIG. 5 illustrates the boosted voltage versus power supply voltage for the circuit of FIG. 3.

The inverter pair M46-M47 has a higher switching threshold then M49-M50, due to M46 having a larger gain than M47, whereas inverter M43-M44 has a still higher threshold. The result is that threshold control lines TH1-TH3 activate the corresponding boost capacitors (C30-C32 in FIG. 3, respectively) as the voltage level of Vcc decreases, and deactivate them when Vcc increases, as noted above. The degree of boost is determined in part by the size of the boost capacitors in relation to the load capacitance (C33 in FIG. 3). Note that the deactivated capacitors also serve as a load to some extent, depending on the output resistances of the associated inverters. A typical relationship between the boost voltage at node 38 ($V_{BOOST}$) versus Vcc is shown in FIG. 5. Note that $V_{BOOST}$ ranges only from about 6 to 7 volts when Vcc ranges from about 4 to 7 volts. Hence, a significantly improved degree of regulation of the boost is obtained as compared to prior art techniques (FIG. 2). The foregoing discussion has shown switching thresholds that are the same whether the power supply level is increasing or decreasing. However, it is alternately possible to include a hysteresis in one or more of the thresholds. Then, a given capacitor is activated at a different (typically lower) power supply voltage than that at which it is deactivated. The hysteresis can be used to reduce the effects of noise or other disturbances that could cause "hunting" of the boosted voltage. Hence, as used herein, the term "threshold" includes the possibility of a hysteresis. However, the amount of the hysteresis for a given threshold is typically less than the difference in thresholds between activation (or deactivation) of successive boost capacitors.

Figure 1:
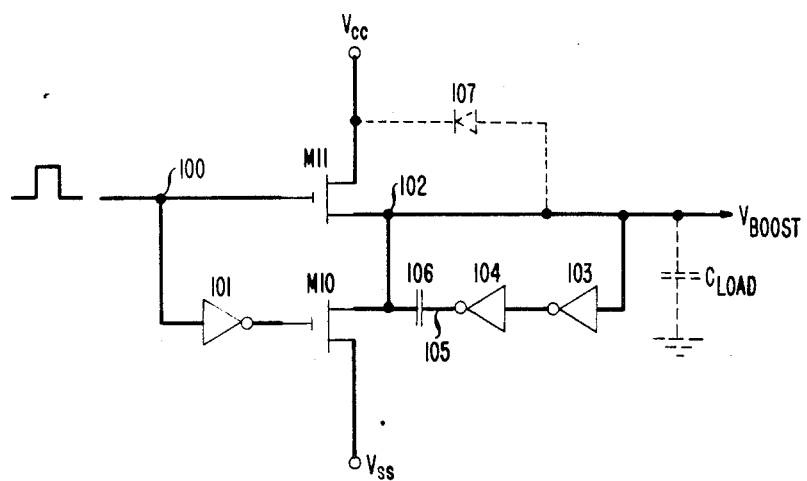
FIG. 1 illustrates a typical prior art boost generator.

The present technique is readily implemented with typical complementary field effect transistor (e.g., CMOS) technology, but may also be implemented with bipolar transistors. Note also that while a positive boost voltage has been discussed for the illustrative case herein, a negative boost voltage is also possible. That is, voltages more negative than the reference power supply potential (Vss) are possible. In that case, the charging and discharging transistors (M11, M10 in FIG. 1) are typically p-channel devices. The terms referring to the voltage levels associated therewith then refer to the absolute magnitude of the voltages with respect to the reference level. Note also that the above discussion has been in terms of two power supply voltages (e.g., +5 and 0 volts). However, integrated circuits are known that operate with a greater number of power supply levels. For example, emitter coupled logic (ECL) circuits operate with three voltage levels, typically 0, −2, and −5.2 volts. The boosting according to the present technique may be accomplished with respect to any of the power supply voltage levels. However, it is most typically utilized with respect to the most positive or most negative power supply voltage levels supplied to the integrated circuit.

What is claimed is:

1. An integrated circuit comprising a node adapted to being boosted to a voltage level in excess of a power supply level applied thereto, characterized in that means are provided for boosting said node an amount dependent on said power supply level, with said means comprising a first boost capacitor that is activated when said power supply level is below a first threshold, and is deactivated when said power supply level is above said first threshold.

2. The integrated circuit of claim 1 further comprising an additional boost capacitor that is activated when said power supply level is below a second threshold, and is deactivated when said power supply level is above said second threshold, wherein said second threshold is less than said first threshold.

3. The integrated circuit of claim 1 further comprising a row of memory cells each of which comprises an information storage capacitor and an access transistor connected thereto, wherein said row of memory cells is selected when a corresponding row conductor is placed at a high voltage level, and wherein said node adapted to being boosted supplies said high voltage level.

4. The integrated circuit of claim 1 further comprising a voltage comparator means of activating said boost capacitor when said power supply level is less than said first threshold, and for deactivating said boost capacitor when said power supply level is above said first threshold.

5. The integrated circuit of claim 4 wherein said voltage comparator comprises an inverter comprising a p-channel field effect transistor and an n-channel field effect transistor having a first gain ratio.

6. The integrated circuit of claim 5 wherein said voltage comparator means further comprises a second inverter comprising a p-channel field effect transistor and an n-channel field effect transistor having a second gain ratio different from said first gain ratio.

7. The integrated circuit of claim 1 wherein said means provides a hysteresis for said first threshold, wherein said first boost capacitor is activated at a lower power supply level than that at which it is deactivated.

* * * * *